United States Patent
Song et al.

(10) Patent No.: US 12,105,963 B2
(45) Date of Patent: Oct. 1, 2024

(54) NAND STRING READ VOLTAGE ADJUSTMENT

(71) Applicant: SanDisk Technologies LLC, Addison, TX (US)

(72) Inventors: Yi Song, San Jose, CA (US); Jiahui Yuan, Fremont, CA (US); Yanjie Wang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 153 days.

(21) Appl. No.: 17/940,465

(22) Filed: Sep. 8, 2022

(65) Prior Publication Data

US 2024/0086074 A1    Mar. 14, 2024

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ..... G06F 3/0619; G06F 3/0653; G06F 3/0679
USPC .................................. 365/189.15
See application file for complete search history.

(56) References Cited

U.S. PATENT DOCUMENTS

| | | | |
|---|---|---|---|
| 10,311,921 B1 * | 6/2019 | Parkinson | G11C 13/0004 |
| 2008/0159007 A1 | 7/2008 | Sekar et al. | |
| 2011/0199833 A1 | 8/2011 | Shim et al. | |
| 2012/0081964 A1 | 4/2012 | Li | |
| 2014/0133231 A1 * | 5/2014 | Kim | G11C 16/28 365/185.11 |
| 2014/0269070 A1 | 9/2014 | Hsiung et al. | |
| 2015/0162088 A1 | 6/2015 | Dusija et al. | |
| 2017/0271031 A1 | 9/2017 | Sharon et al. | |
| 2018/0025777 A1 | 1/2018 | Jacobvitz et al. | |
| 2019/0102097 A1 | 4/2019 | Madraswala et al. | |
| 2019/0371402 A1 * | 12/2019 | Lin | G11C 5/063 |
| 2019/0385684 A1 | 12/2019 | Bhatia et al. | |
| 2020/0160920 A1 | 5/2020 | Karakulak et al. | |
| 2020/0365213 A1 * | 11/2020 | Jeon | G11C 16/32 |
| 2020/0372961 A1 | 11/2020 | Moschiano et al. | |
| 2021/0174881 A1 | 6/2021 | Sakakibara et al. | |

* cited by examiner

*Primary Examiner* — Ly D Pham
(74) *Attorney, Agent, or Firm* — Vierra Magen Marcus LLP

(57) ABSTRACT

An apparatus includes a control circuit configured to connect to NAND strings that are connected to bit lines, where each bit line is connected to a plurality of NAND strings in a corresponding plurality of regions of a block. The control circuit is configured to apply a read voltage in read operations directed to NAND strings of the plurality of regions of the block and subsequently adjust the read voltage by a first predetermined amount for read operations directed to NAND strings of a first region of the block. The control circuit is further configured to adjust the read voltage by a second predetermined amount for read operations directed to NAND strings of a second region of the block. The first and second predetermined amounts are based on respective locations of the first and second regions in the block.

20 Claims, 16 Drawing Sheets

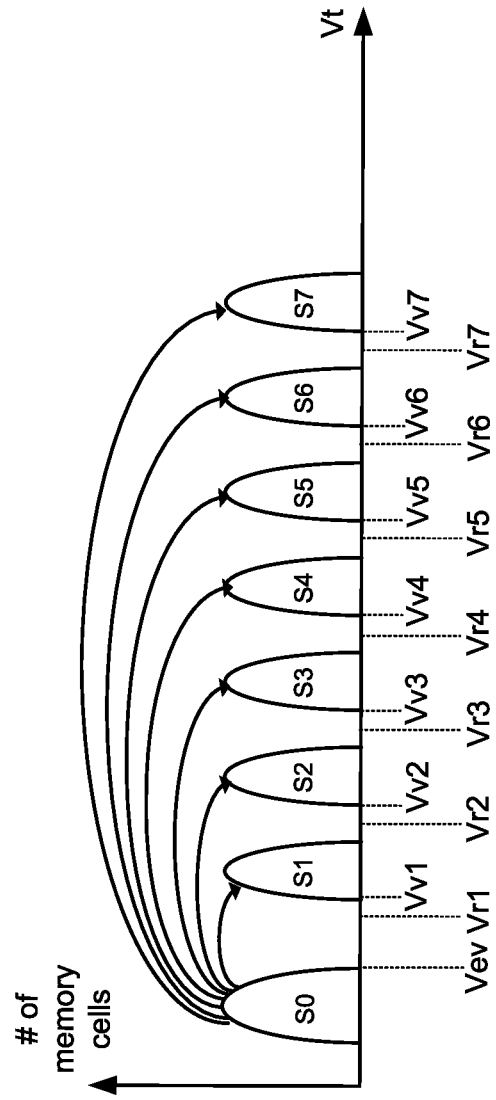

FIG. 8C

| Read voltage | First region(s) | Second region(s) |
|---|---|---|
| Initial read voltage | Vr1 | Vr1 |
| Adjusted read voltage | Vr1+δV | Vr1+δV+δV' |

FIG. 9

| Read voltage | First region(s) | Second region(s) | Third region(s) |
|---|---|---|---|
| Initial read voltage | Vr1 | Vr1 | Vr1 |
| Adjusted read voltage | Vr1+δV | Vr1+δV+δV' | Vr1+δV+δV'' |

FIG. 10

| Cycle count | Read Voltage | First region(s) | Second region(s) |
|---|---|---|---|
| 0 – 50,000 | Initial read voltage | Vr1 | Vr1 |
| 50,000 – 75,000 | 1st Adjusted read voltages | Vr1+δV1 | Vr1+δV1+δV1' |
| 75,000 – 100,000 | 2nd Adjusted read voltages | Vr1+δV2 | Vr1+δV2+δV2' |
| > 100,000 | 3rd Adjusted read voltages | Vr1+δV3 | Vr1+δV3+δV3' |

FIG. 11

| Read voltage | First region(s) | First region(s) |
|---|---|---|
| Initial read voltages | Vr1, Vr2 ... Vr7 | Vr1, Vr2 ... Vr7 |
| Adjusted read voltage | Vr1+δV1, Vr2+δV2 ... Vr7+δV7 | Vr1+δV1', Vr2+δV2' ... Vr7+δV7' |

FIG. 12

| Read voltages | First region(s) | Second region(s) | ... | Kth region(s) |
|---|---|---|---|---|
| Initial read voltages | Vr1, Vr2 ..... Vrn | Vr1, Vr2 ..... Vrn | ... | Vr1, Vr2 ..... Vrn |
| 1st Adjusted read voltages | | | ... | |
| 2nd Adjusted read voltages | ⋮ | | ... | ⋮ |
| ⋮ | | ⋮ | ... | |
| Mth Adjusted read voltages | | | ... | |

NAND STRING READ VOLTAGE ADJUSTMENT

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIG. 5 illustrates aspects of programming operations according to an example.

FIGS. 8A-C illustrate an example of threshold voltage distributions and a corresponding read voltage changing differently for different NAND strings in different regions of a block.

FIG. 9 illustrates an example of a lookup table with predetermined amounts to adjust a read voltage in different regions of a block.

FIG. 10 illustrates an example of a lookup table with predetermined amounts to adjust a read voltage multiple times in different regions of a block.

FIG. 11 illustrates an example of a lookup table with predetermined amounts to adjust a plurality of read voltages in different regions of a block.

FIG. 12 illustrates an example of a lookup table with predetermined amounts to adjust n read voltages M times in K regions of a block.

DETAILED DESCRIPTION

Techniques are provided for operating non-volatile memory arrays that include NAND strings connected to bit lines, with each bit line connected to a plurality of NAND strings in a corresponding plurality of regions of a block (e.g., one NAND string per region connected to a given bit line). Reading non-volatile memory cells accurately may include using one or more read voltages that accurately discriminate between different threshold voltage distributions. As threshold voltage distributions change (e.g., over time, with use) one or more read voltage may be adjusted to maintain accuracy. Reading memory cells of such NAND strings may proceed region by region. In some cases, threshold voltage distributions of different NAND strings in different regions of a block may change differently so that it becomes hard to find a read voltage that provides sufficient accuracy for reading.

In examples of the present technology, different read voltages may be used for read operations directed to NAND strings of a different regions of a block based on respective locations of the regions in the block. For example, one or more read voltage for reading memory cells in NAND strings located in edge regions of a block (e.g., regions at or near an edge of a block) may be adjusted by a first amount while one or more read voltage for reading memory cells in NAND strings located in middle regions of the block (e.g., regions at or near the middle of the block) may be adjusted by a second amount that is different to the first amount (e.g., greater increase in read voltage for a middle region than an edge region). Thus, the present technology presents technical solutions to the technical problem of accurately reading memory cells across a block over time.

Figure 1:
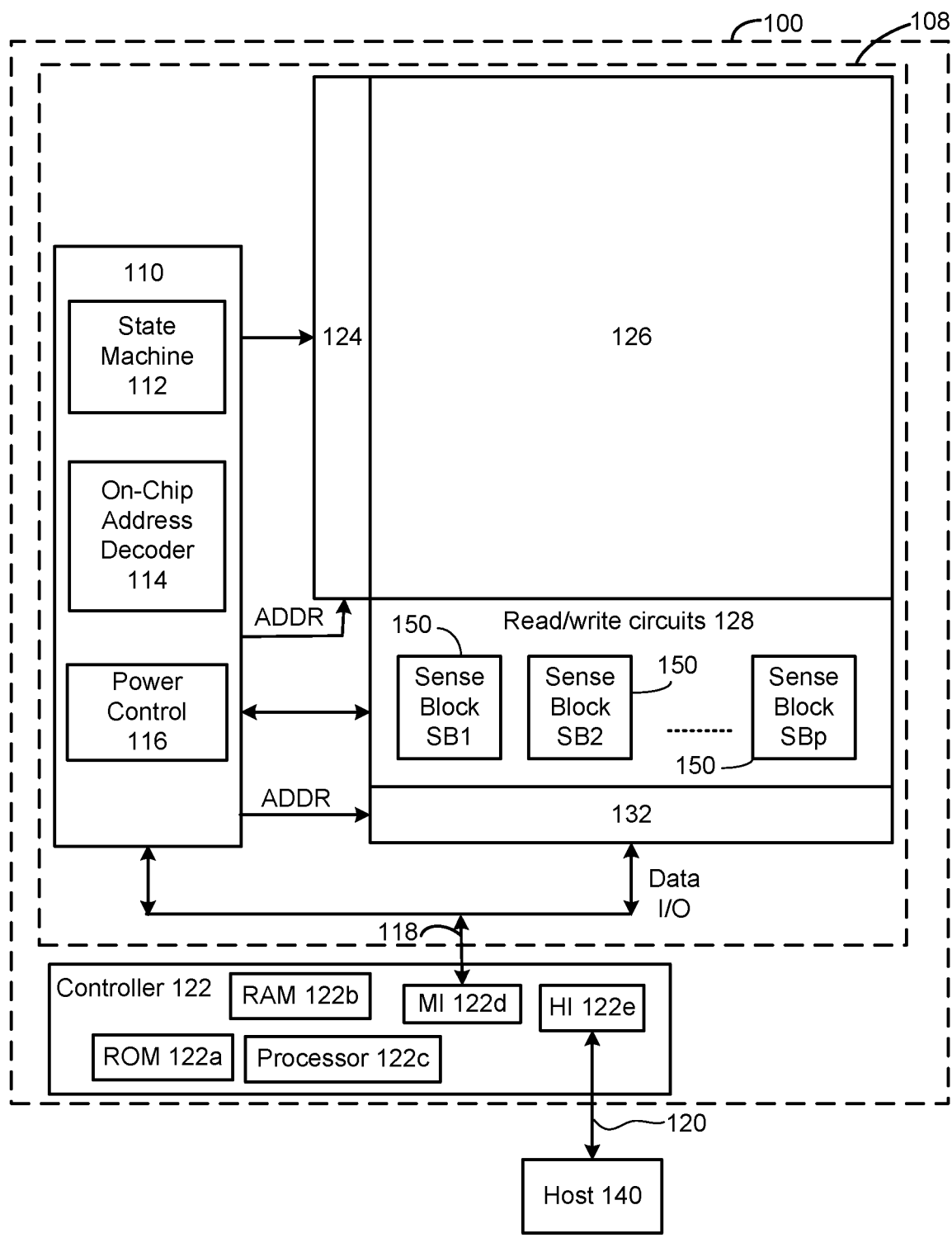
FIG. 1 is a functional block diagram of a memory device.

FIG. 1-FIG. 4D describe examples of memory systems that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuit 110, and read/write circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuit 110 cooperates with the read/write circuits 128 to perform memory operations (e.g., write, read, erase and others) on memory structure 126, and includes state machine 112, an on-chip address decoder 114, and a power control circuit 116. In one embodiment, control circuit 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs various functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuit 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used. The exact type of memory array architecture or memory cell included in memory structure 126 is not limited to the examples above.

Figure 2A:
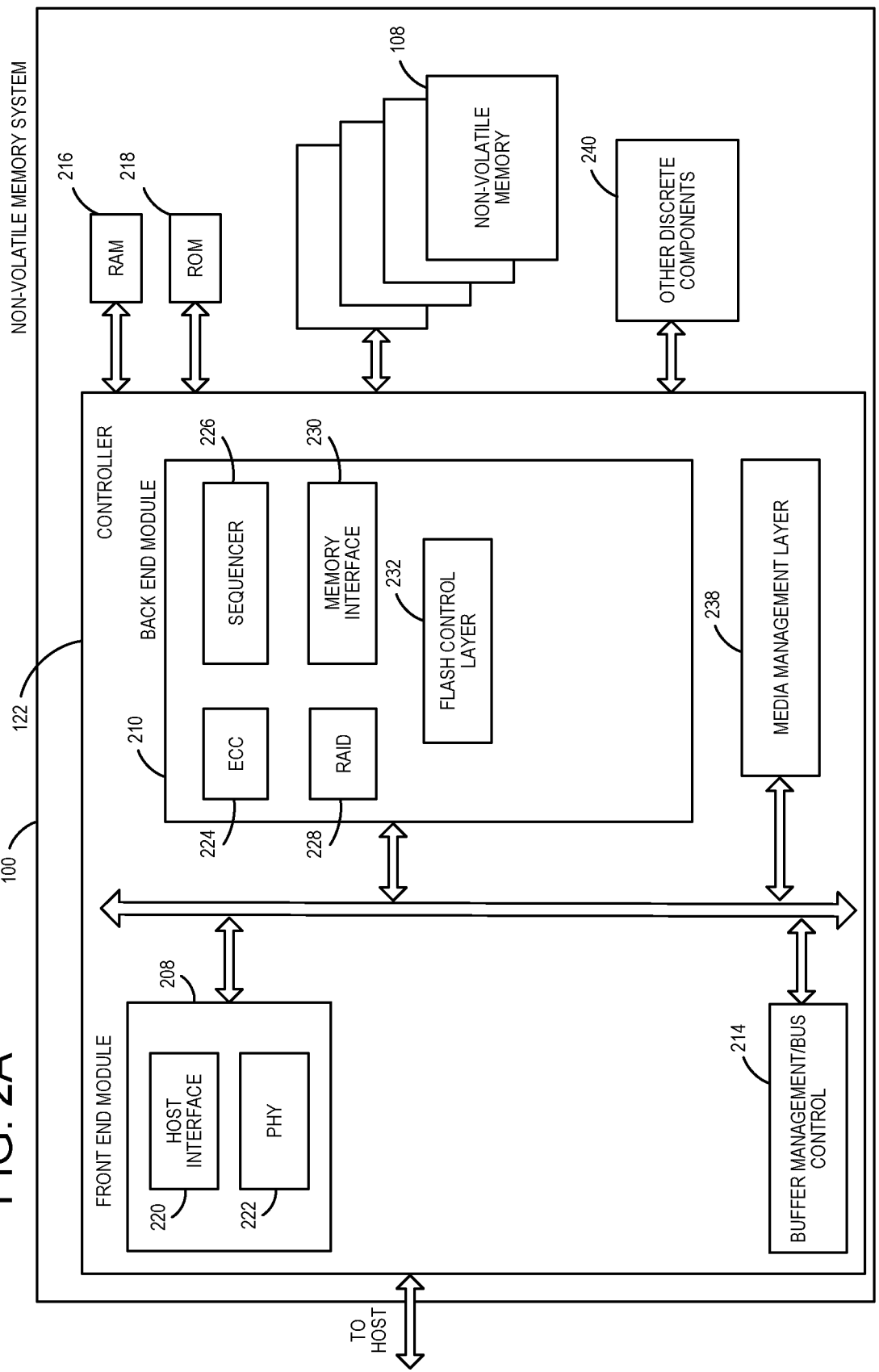
FIGS. 2A-B are block diagrams depicting embodiments of a memory system.

FIG. 2A is a block diagram of example memory system 100, depicting more details of one embodiment of controller 122. The controller in FIG. 2A is a flash memory controller but note that the non-volatile memory die 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2A, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2A may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2A is one example implementation that may (or may not) use the components of controller 122 depicted in FIG. 1 (i.e., RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2A as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g., as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 2A include media management layer 238, which performs wear leveling of memory cells of non-volatile memory die 108. Memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of memory die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile memory system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

In one embodiment, the control circuit(s) (e.g., control circuits 110) are formed on a first die, referred to as a control die, and the memory array (e.g., memory structure 126) is formed on a second die, referred to as a memory die. For example, some or all control circuits (e.g., control circuit 110, row decoder 124, column decoder 132, and read/write circuits 128) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

Figure 2B:
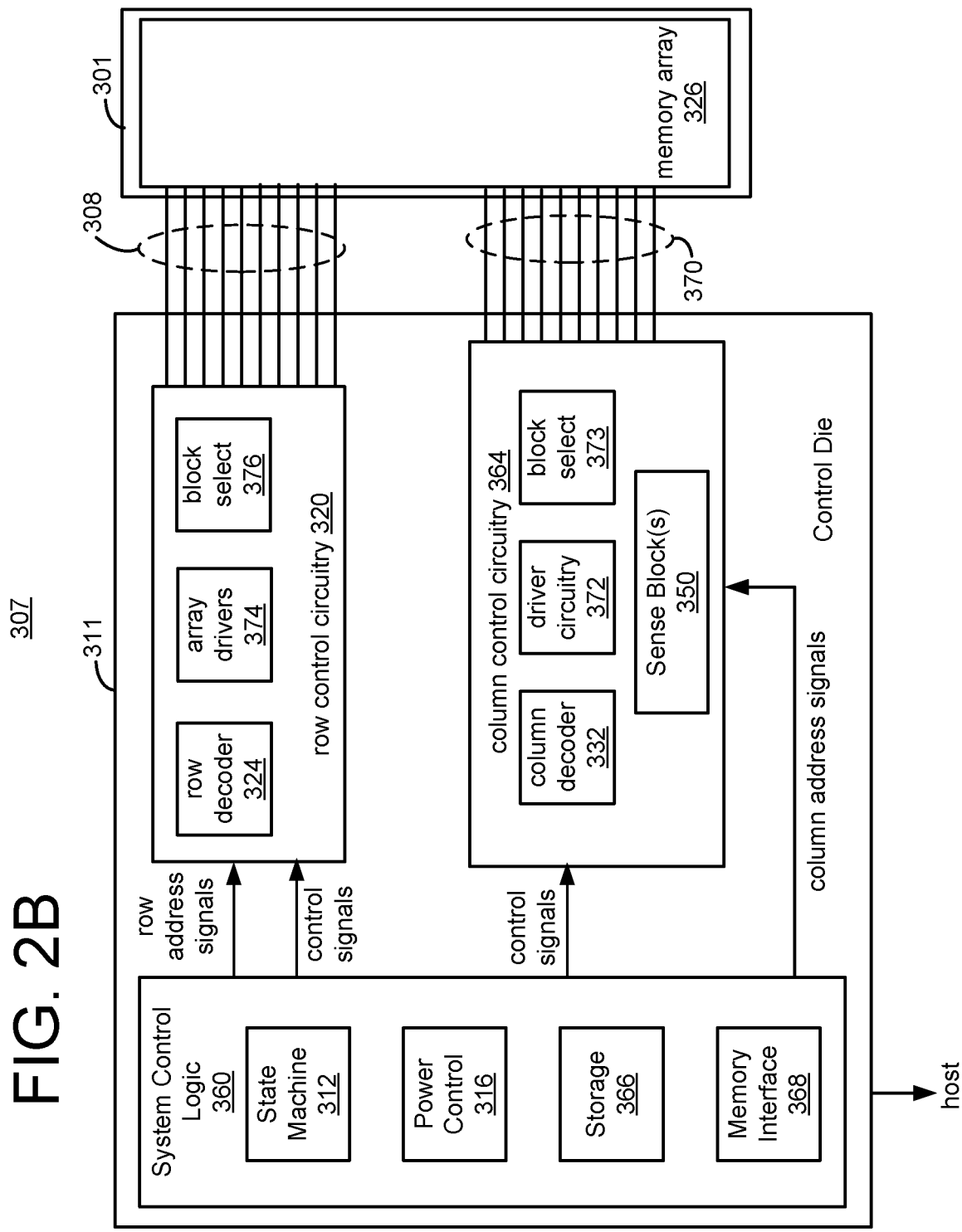

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package in memory system 100. The integrated memory assembly 307 includes two types of semiconductor die (or more succinctly, "die"). Memory die 301 includes memory array 326 (memory structure 326, which may be any suitable memory as described with respect to memory structure 126). Memory array 326 may contain non-volatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory dies 301. In some embodiments, each control die 311 is affixed (e.g., bonded) to at least one of the memory dies 301.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
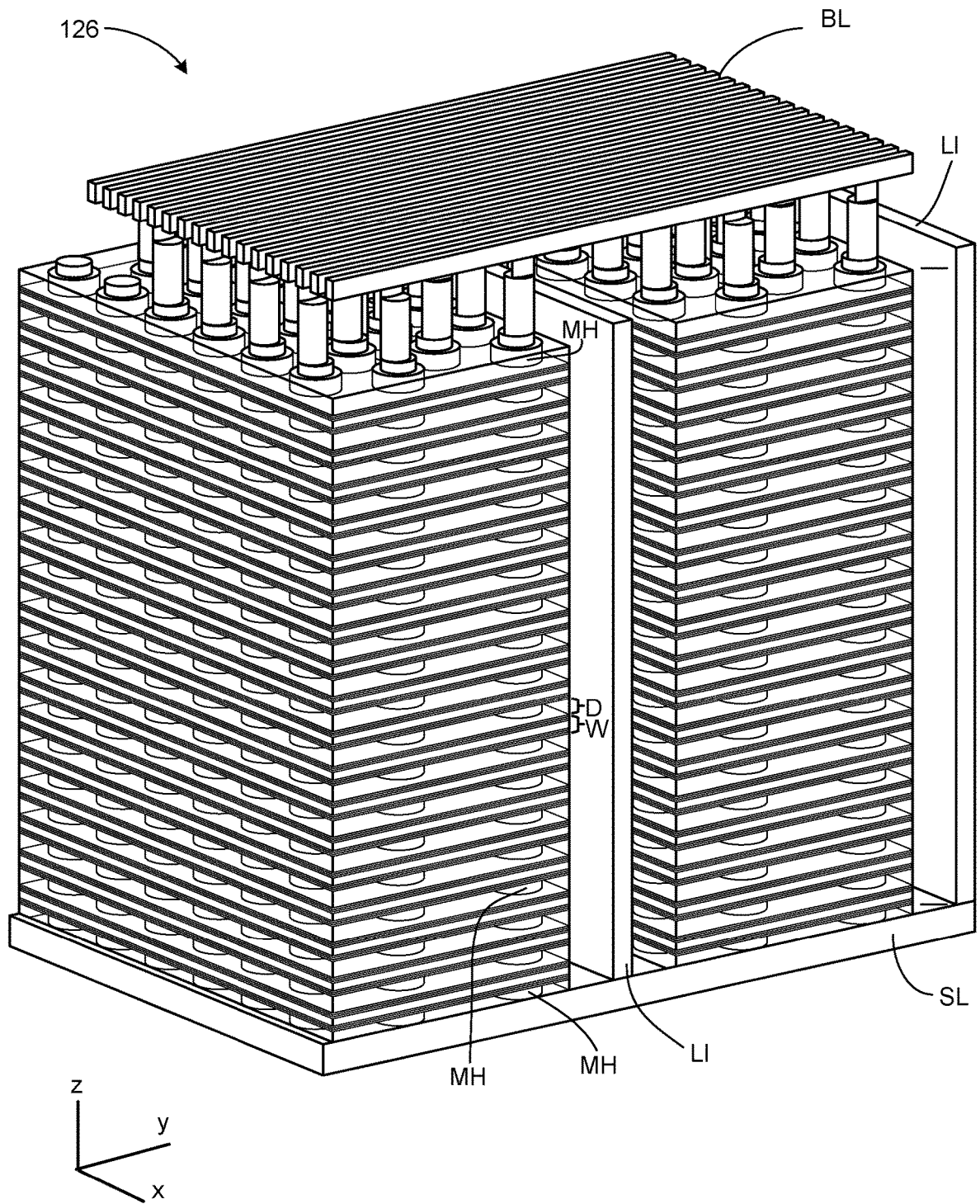
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126 or 326, which includes a plurality non-volatile memory cells. For example, FIG. 3 shows a portion of one block of memory. The structure depicted includes a set of bit lines BL positioned above a stack of alternating dielectric layers and conductive layers. For example, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into "fingers" in regions that are separated by local interconnects LI. FIG. 3 shows two regions, each with respective NAND strings, and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 or 326 are provided below with respect to FIGS. 4A-4D.

Figure 4A:
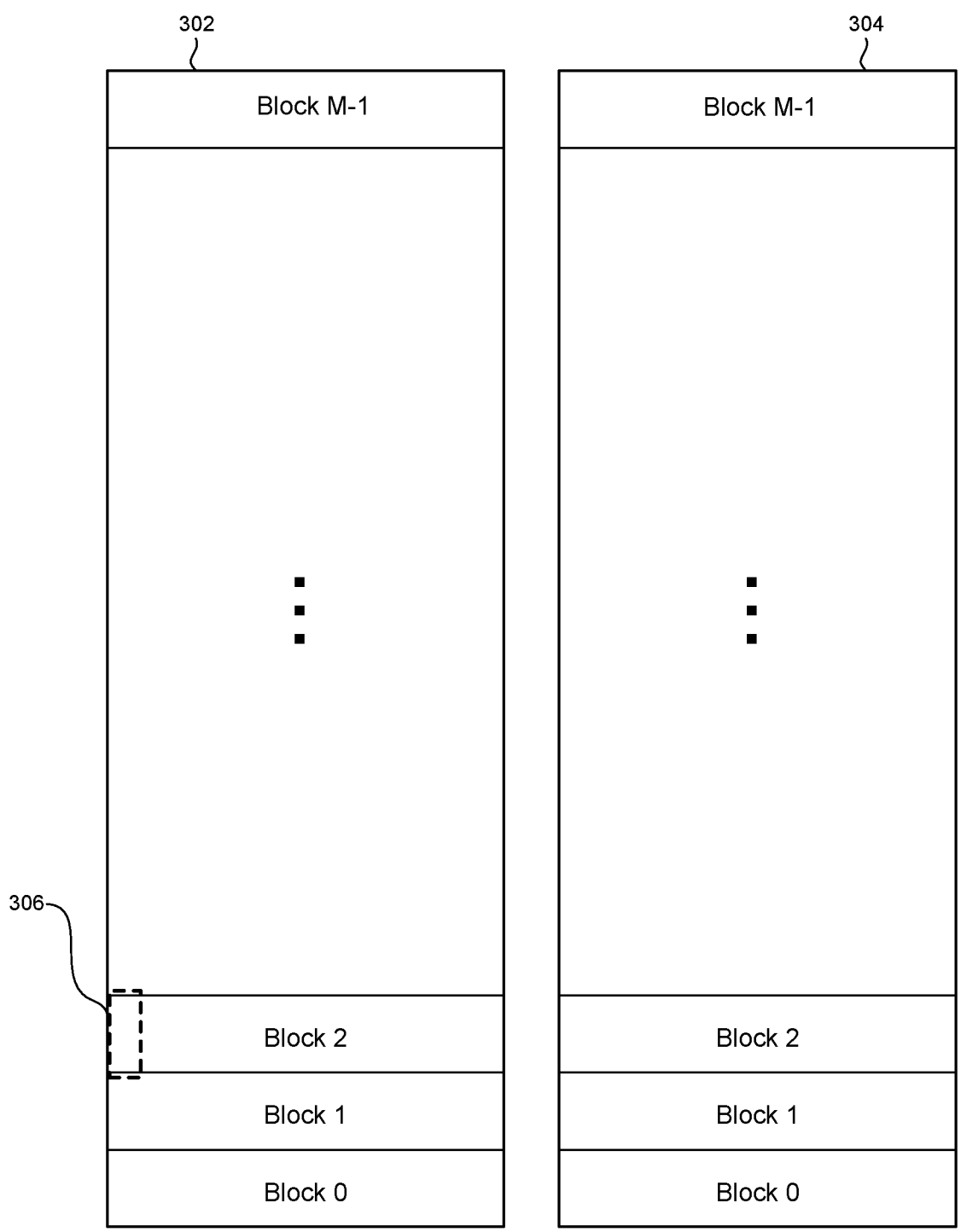
FIG. 4A is a block diagram of a memory structure having two planes.

FIG. 4A is a block diagram explaining one example organization of a memory structure (e.g., memory structure 126 or 326), which is divided into two planes 302 and 304. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines. Blocks may be connected by bit lines that are shared by multiple blocks.

Figure 4B:
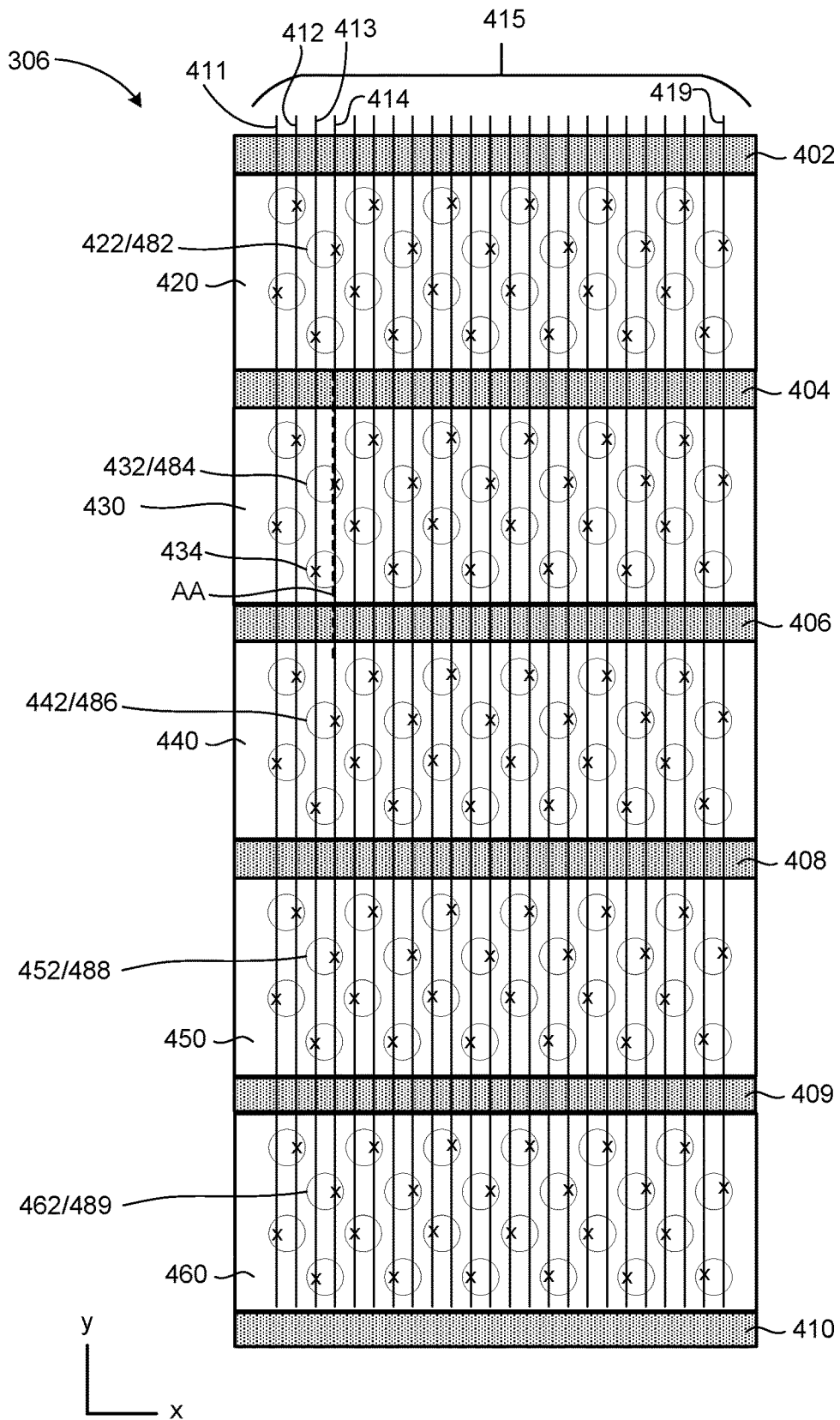
FIG. 4B depicts a top view of a portion of a block of memory cells.
Figure 4C:
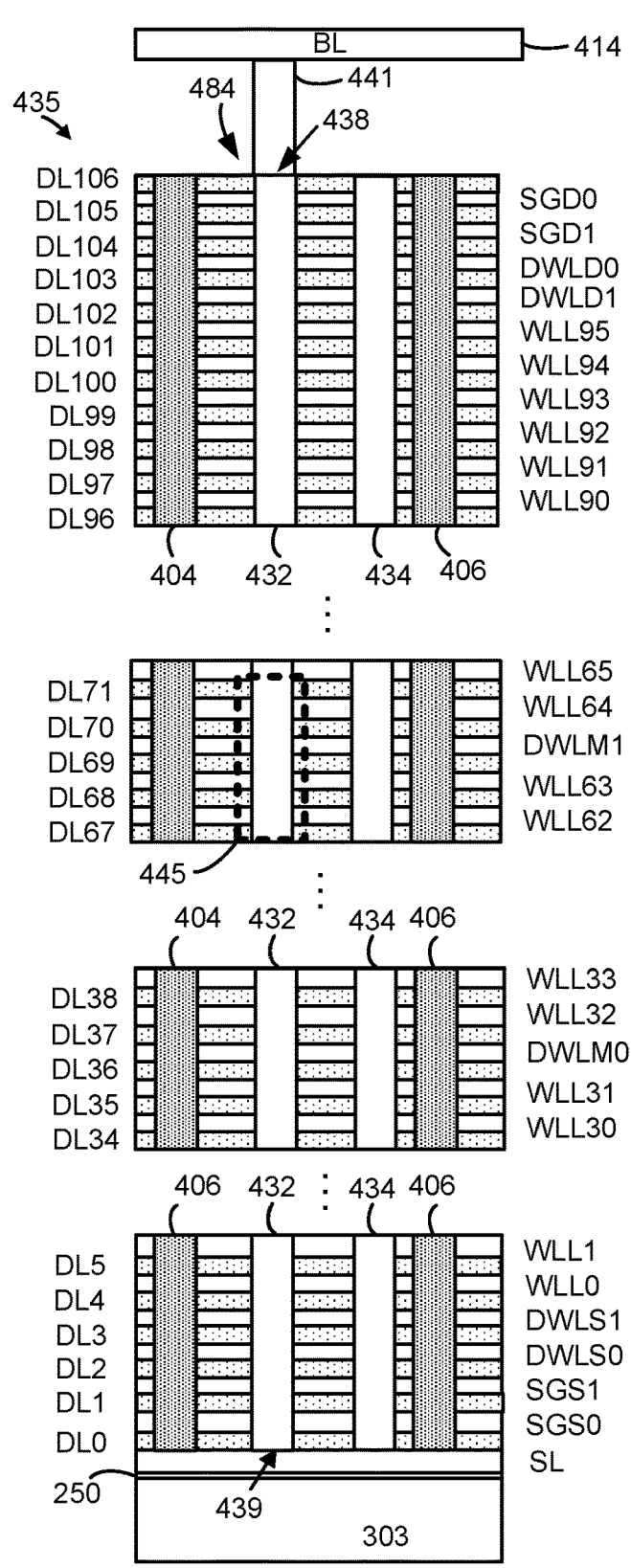
FIG. 4C depicts an embodiment of a stack showing a cross-sectional view along line AA of FIG. 4B.
Figure 4D:
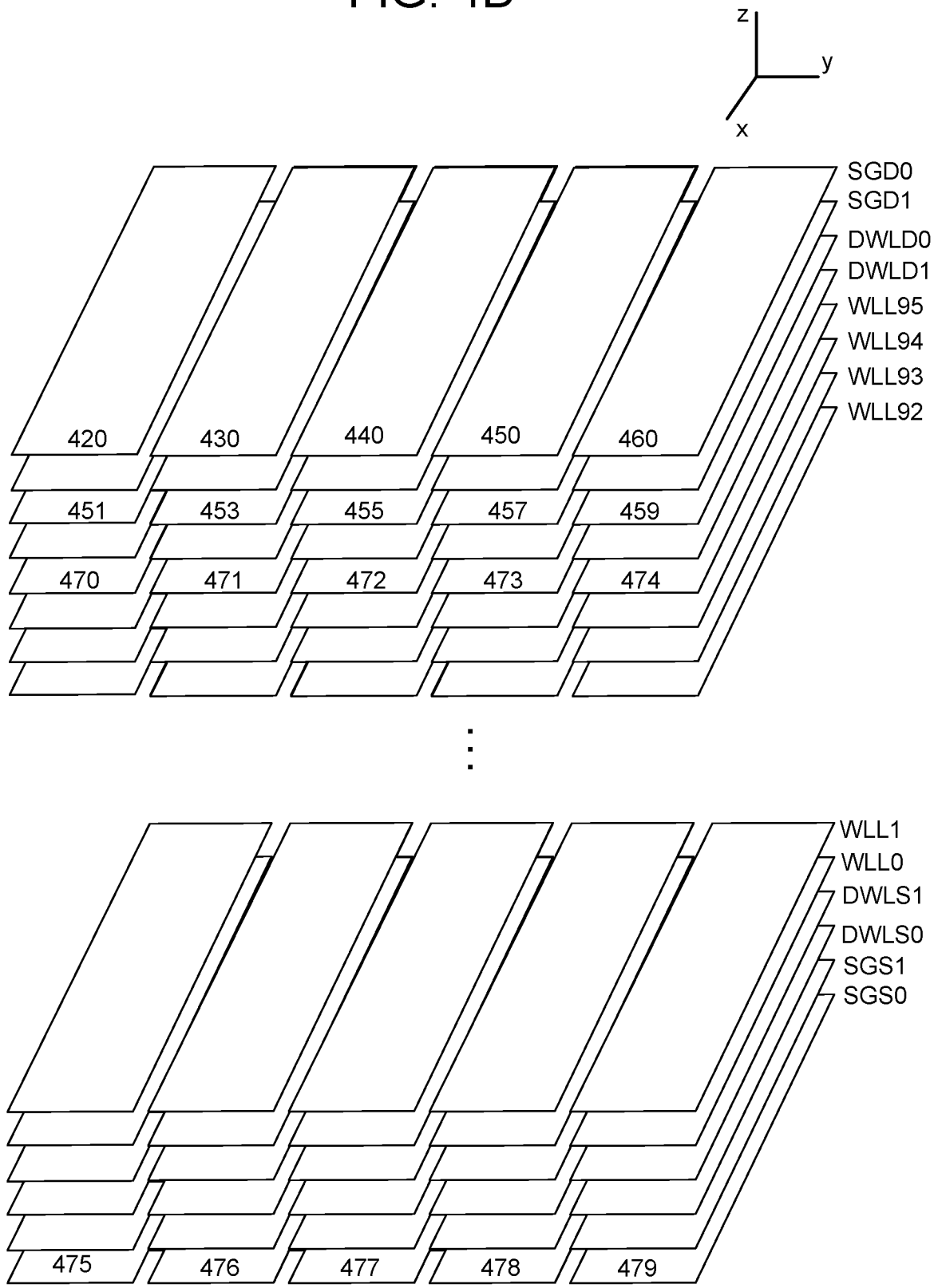
FIG. 4D depicts an alternative view of the select gate layers and word line layers of the stack 435 of FIG. 4C.

FIGS. 4B-4D depict an example three dimensional ("3D") NAND structure that corresponds to the structure of FIG. 3 and can be used to implement memory structure 126 of FIG. 2A or 326 of FIG. 2B. FIG. 4B is a block diagram depicting a top view of a portion of one block from memory structure 126 or 326. The portion of the block depicted in FIG. 4B corresponds to block portion 306 in block 2 of FIG. 4A. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 462. Vertical column 422 implements NAND string 482. Vertical column 432 implements NAND string 484. Vertical column 442 implements NAND string 486. Vertical column 452 implements NAND string 488. Vertical column 462 implements NAND string 489. More details of the vertical columns are provided below. The block depicted in FIG. 4B extends to include more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452 and 462 (one column, or NAND string, in each region).

The block depicted in FIG. 4B includes a set of local interconnects 402, 404, 406, 408, 409 and 410 that connect to a source line below the vertical columns. Local interconnects 402, 404, 406, 408, 409 and 410 also serve to divide each layer of the block into five regions; for example, the block depicted in FIG. 4B is divided into regions 420, 430, 440, 450 and 460, which are separated by local interconnects 402, 404, 406, 409 and 410, so that each layer is divided into portions which may be referred to as fingers. In the layers of the block that implement memory cells, the five portions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column, or NAND string, in each of regions 420, 430, 440, 450 and 460. In one embodiment, NAND strings of different regions that are connected to a common bit line may be connected to the same word line (via different word line fingers on the same level that are connected together); therefore, the system uses the source side selection lines and the drain side selection lines to choose one (or another subset) to be subjected to a memory operation (program, verify, read, and/or erase). A given bit line may connect to a fixed number of NAND strings in each block. For example, bit lines 415 each connect to five NAND strings in block portion 306 (e.g., bit line 414 connects to NAND strings 482, 484, 486, 488 and 489). When performing memory access operations (e.g., programming and reading), such strings may be accessed at different times. For example, when programming or reading memory cells in a given level of a block, programming may proceed sequentially from region to region (string to string). Thus, memory access operations may access some or all NAND strings in region 420 of the block at a first time, access some or all NAND strings in region 430 at a second time, access some or all NAND strings in region 440 at a third time, access some or all NAND strings in region 450 at a fourth time and access some or all NAND strings in region 460 at a fifth time. In other examples, fewer or more than five such regions may be provided in a block. The NAND strings in a region of a block may be referred to collectively for convenience when referring to access operations directed to parallel access to such NAND strings. For example, accessing NAND strings of region 420 may be referred to as accessing "String 1," accessing NAND strings of region 430 may be referred to as accessing "String 2," accessing NAND strings of region 440 may be referred to as accessing "String 3," accessing NAND strings of region 450 may be referred to as accessing "String 4" and accessing NAND strings of region 460 may be referred to as accessing "String 5."

FIG. 4B also shows the vertical columns being staggered. In other embodiments, different patterns of staggering can be used. In some embodiments, the vertical columns are not staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG portions in regions 420, 430, 440, 450 and 460 consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer portions 451, 453, 455, 457 and 459. A dummy memory cell, also referred to as a non-data memory cell, does not store data and is ineligible to store data, while a data memory cell is eligible to store data.

Below the dummy word line layers are the data word line layers. For example, WLL95 comprises word line layer regions 470, 471, 472, 473 and 474.

Below the data word line layers are the source-side dummy word line layers DWLS0 and DWLS1. Each source-side dummy word line can be independently controlled, in one approach (e.g., different voltages may be applied to DWLS0 and DWLS1). Alternatively, the source-side dummy word lines may be connected and commonly controlled (e.g., same voltage may be applied to DWLS0 and DWLS1)

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477, 478 and 479 as shown in FIG. 4D. Each SG line can be independently controlled, in one approach. Or the SG lines can be connected and commonly controlled.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Although the example memory system of FIGS. 3-4D is a three dimensional memory structure that includes vertical NAND strings with charge-trapping material, other (2D and 3D) memory structures can also be used with the technology described herein (e.g., other memory structures with NAND strings including a plurality of data memory cells coupled to a plurality of data word lines in series with a plurality of dummy memory cells connected to a plurality of dummy word lines). Different operations for accessing data in non-volatile memory cells (e.g., read, program, and program verify) that are described below may be applied to one or more of the example memory systems described above with respect to FIGS. 1-4D.

Typically, the program voltage applied to the control gates (via a selected word line) during a program operation is applied as a series of program pulses. Between programming pulses of program steps are a set of verify pulses to perform verification in verify steps (e.g., alternating program steps and verify steps in a program operation). In many implementations, the magnitude of the program pulses is increased with each successive pulse by a predetermined step size.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with an erased state so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

FIG. 5 shows threshold voltage distributions for eight data states, S0 to S7, corresponding to three bits of data per cell (Three Level Cell, or TLC). Also shown are seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 used in read verify steps during a programming operation. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5A also shows Vev, which is a voltage level to test whether a memory cell has been properly erased (e.g., whether a memory cell is in the S0 data state).

In general, during sensing of verify and read operations, the selected word line is connected to a voltage (one example of a reference signal or read voltage), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to sense whether a threshold voltage of the concerned memory cell has reached such level. After applying the read voltage to the word line, the conduction current of the memory cell is measured to determine whether the memory cell turned on (conducted current) in response to the voltage applied to the word line. If the conduction current is measured to be greater than a certain value (e.g., Isense), then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected data memory cells are provided with one or more read pass voltages (also referred to as bypass voltages) at their control gates so that these data memory cells will operate as pass gates (e.g., conducting current regardless of whether they are programmed or erased), select gates of selected NAND strings are provided with sufficient voltage (e.g., select voltages via select lines) to make corresponding select transistors conductive ("turn on") and dummy memory cells of selected NAND strings are provided with sufficient voltage (e.g., dummy word line voltage via dummy word lines) to make corresponding dummy memory cells conductive.

There are many ways to measure the conduction current of a memory cell during sensing in a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for sensing during verify or read operations. Other read and verify techniques known in the art can also be used.

In some cases, threshold voltage distributions of memory cells that are read during a read operation may be changed from corresponding threshold voltage distributions of the data memory cells during verify steps of a program operation used to program the data memory cells (e.g., as illustrated in FIG. 5B).

Figure 6:
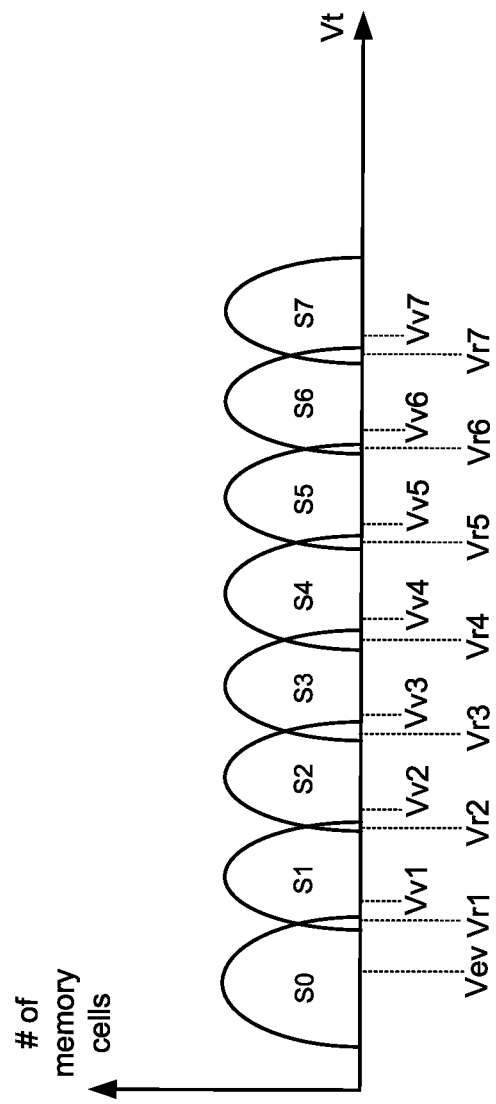
FIG. 6 illustrates an example of threshold voltage distributions of memory cells.

FIG. 6 shows an example of threshold voltage distributions of a plurality of data memory cells found by performing a read operation (e.g., a read operation directed to the data memory cells that were programmed as shown in FIG. 5). Distributions S0-S7 are partially overlapping because distributions are wider than shown in FIG. 5. Such wider distributions may result in misreading of stored data (e.g., data memory cells in an upper tail of a distribution may be read as being in a higher state so that some data memory cells in state S0 are read as being in S1 when read at Vr1, some data memory cells in state S1 are read as being in state S2 when read at Vr2, and so on). While some errors may be corrected by ECC, it may be desirable to reduce the number of such errors.

In some cases, threshold voltage distributions of programmed memory cells change with time and/or usage. For example, early in a product's lifecycle threshold voltage distributions may be more distinct (e.g., as depicted in FIG. 5) and may become broader and more overlapping towards the end of the product's lifecycle (e.g., as depicted in FIG. 6). One or more distributions may also shift (e.g., center and/or tail(s) of a distribution may change). For example, one or more distribution (e.g., erased distribution, S0) may shift upwards (e.g., due to charge trapping or other effects). In order to deal with distribution changes with time and/or use, read voltages may be adjusted over the life of a product so that the read voltage corresponds to the actual intersection of distributions. For example, one or more of Vr1, Vr2, Vr3, Vr4, Vr5, Vr6 and Vr7 may be adjusted to more accurately discriminate between distributions that have shifted with time and/or use.

Figure 7A:
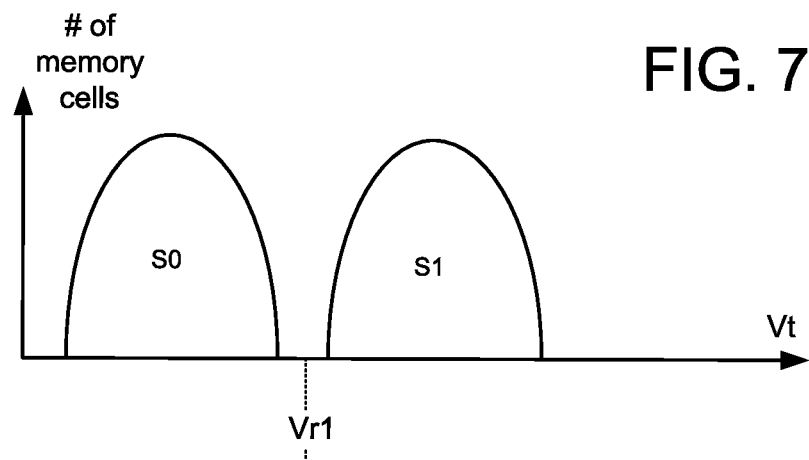
FIGS. 7A-B illustrate an example of changing threshold voltage distributions.

FIG. 7A illustrates an example showing two threshold voltage distributions (e.g., both distributions of a SLC memory, or two of three or more distributions of an MLC memory) early in a product lifecycle (e.g., at Beginning of Life, or "BOL"). Read voltage Vr1 is used to distinguish between threshold voltage distributions corresponding to data state S0 and data state S1.

Figure 7B:
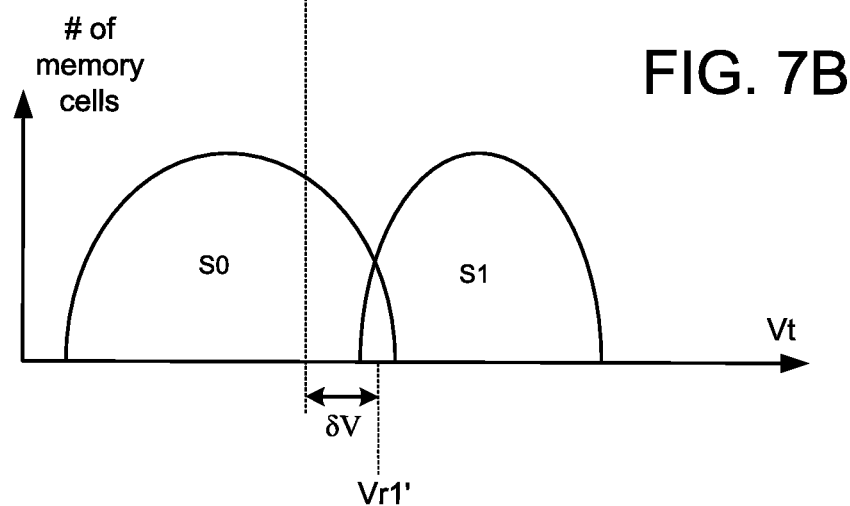

FIG. 7B illustrates the threshold voltage distributions of FIG. 7A after some time and use (e.g., after an elapsed period, late in the product lifecycle, or at the End of Life, or "EOL"). In response to changes in threshold voltage distributions for data states S0 and S1, the read voltage is increased from Vr1 to Vr1' by and amount δV to give a more accurate read (e.g., to reduce the number of bad bits detected by Error Correction Code (ECC), or the Failed Bit Count "FBC").

In some cases, changes in distributions of memory cells in a block may be non-uniform. For example, certain NAND strings in a block may experience different time and/or use related changes to other NAND strings in the same block that have experienced the same amount of use. For example, in a given block or portion of a block (e.g., block portion 306 illustrated in FIG. 4B), there may be some physical differences between NAND strings of different regions (e.g., regions 420, 430, 440, 450 and 460), which may cause them to exhibit different use related changes, including different shifting of threshold voltage distributions. Adjusting read voltages (e.g., one or more of Vr1, Vr2, Vr3, Vr4, Vr5, Vr6 and Vr7) for the block may not result in optimal read voltages for all regions in such a block.

Figure 8A:
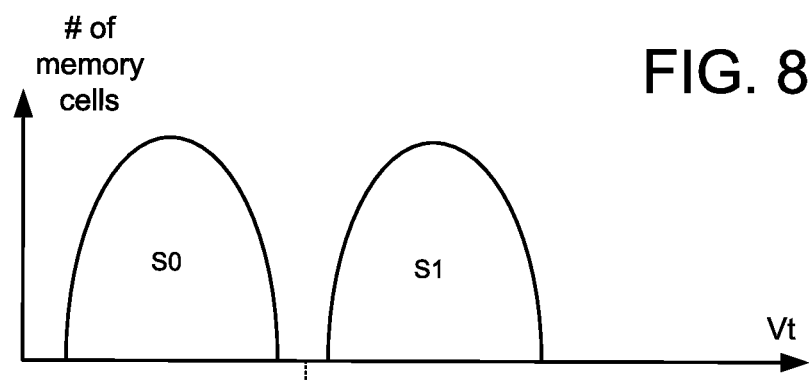

FIG. 8A illustrates an example showing two threshold voltage distributions (e.g., both distributions of a SLC memory, or two of three or more distributions of an MLC memory) early in a product lifecycle (e.g., at Beginning of Life, or "BOL"). Read voltage Vr1 is used to distinguish between threshold voltage distributions corresponding to data state S0 and data state S1 as previously shown in FIG. 7A.

Figure 8B:
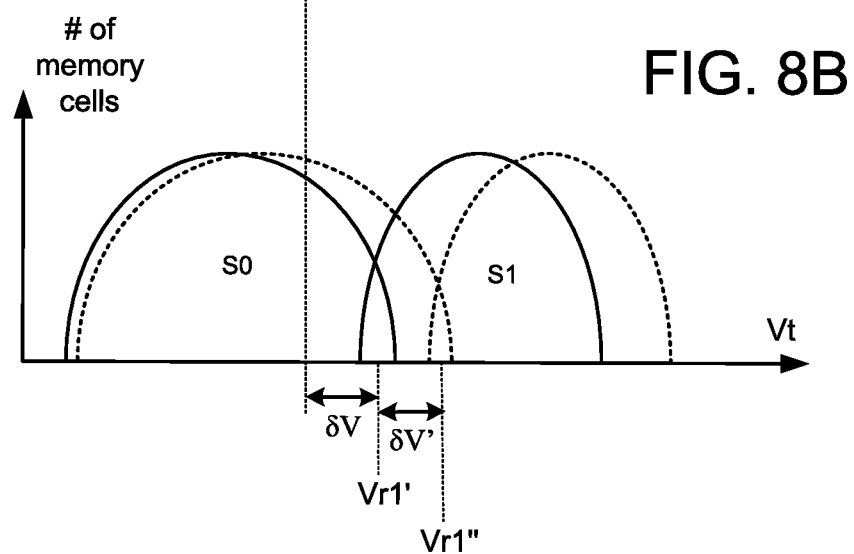

FIG. 8B illustrates the threshold voltage distributions of FIG. 8A after some time and use (e.g., late in the product lifecycle, at the End of Life, or "EOL"). For each data state, S0 and S1, two distributions, corresponding to different NAND strings are shown, one illustrated by a solid line and one by a dotted line. In response to changes in threshold voltage distributions for data states S0 and S1, the read voltage is incremented from Vr1 to Vr1' by and amount $\delta Vr$ to give a more accurate read as previously described. While Vr1' may provide accurate results (e.g., low FBC) for some NAND strings (distributions shown by solid lines), adjusted read voltage Vr1' may not provide accurate results (e.g., may provide high FBC) for other NAND strings (distributions shown by dotted lines).

According to aspects of the present technology, one or more read voltages (e.g., one or more of Vr1, Vr2, Vr3, Vr4, Vr5, Vr6 and Vr7) may be adjusted differently for reading different NAND strings in different regions of a block. For example, one or more read voltages for NAND strings in a first region (e.g., one of regions 420, 430, 440, 450 and 460) may be adjusted by a first amount after a period of use (e.g., in response to a triggering event) while the one or more read voltages for NAND strings in a second region (e.g., another one of regions 420, 430, 440, 450 and 460) may be adjusted by a second amount after the period of use. Such adjustment may be performed per region (e.g., read voltage(s) for each region 420, 430, 440, 450 and 460 may be individually adjusted) or for groups of regions (e.g., regions may be grouped by location and adjusted in groups).

FIG. 8B shows a second adjusted read voltage Vr1" which may be used to read NAND strings of some region(s) of a block while adjusted read voltage Vr1' is used to read NAND strings of other region(s) of the same voltage. Thus, while a single read voltage Vr1 may be uniformly used to read all NAND strings of a block initially, different adjusted read voltages Vr1' (increased by $\delta Vr$ with respect to Vr1) and Vr1" (additionally increased by $\delta Vr'$ with respect to Vr1') may be used later to account for different changes in different regions of a block. While just two adjusted read voltages, Vr1' and Vr1" are shown, the number of adjusted read voltages used in a block is not limited to two and may, for example, be equal to the number of regions in the block (e.g., five in the example of FIG. 4B). While a uniform read voltage may be used initially, this may not always be the case (e.g., different read voltages may be used in different regions initially).

Some region to region variation in how threshold voltage distributions change may be predictable so that corresponding changes in read voltage(s) may be predetermined based on locations of regions in a block. In an example implementation, NAND strings that are in regions at or near the middle of a block may have corresponding read voltage(s) increased more than NAND strings that are in regions at or near the edge of a block. For example, one or more read voltage(s) for NAND strings of region 440 may be increased by an amount (e.g., $\delta Vr+\delta Vr'$) that is greater than for NAND strings of regions 420 and 460 (e.g., increased by Vr). In some cases, intermediate regions 430 and 450 may be grouped with region 440 (e.g., considered as interior regions) and may be subject to the same increase(s) in read voltage. In some cases, intermediate regions 430 may be grouped with regions 420 and 460 (e.g., considered as exterior regions) and may be subject to the same increase(s) in read voltage. In some cases, intermediate regions 430 and 450 may be considered as a separate group (intermediate group) and may be subject to different read voltage increase (s) to other groups. Regions may be grouped into more than three regions in some examples (e.g., where more than five regions are provided in a block).

In some examples, read voltages may be adjusted once during the lifecycle of a product while in other examples, read voltages may be adjusted two or more times during the lifecycle of the product. Adjustment of read voltages may be triggered by a triggering event, e.g., based on elapsed time, a combination of time and temperature, error level (e.g., FBC exceeding a threshold level), a number of write erase cycles, or other factors alone or in combination). In one example, a write erase cycle count may be maintained for a block to record how many times the block has been written and erased. This may provide a measure of wear experienced by the block so that read voltage adjustment can be implemented according to wear. For example, in a memory in which a block has a life expectancy of 100,000 cycles, read voltages may be incremented every 10,000 cycles (10 times), every 20,000 cycles (5 times) or at some other interval. In another example, data read from the block is subject to ECC correction (e.g., by ECC engine 224) from which an error level (e.g., FBC) is obtained. This error level may be compared with one or more threshold error level. An error level for data from the block exceeding a threshold error level may be a triggering event. In some cases, a combination of write erase cycle count and error level may provide a triggering event.

In an example, a lookup table may be used to record how much each read voltage should be adjusted at a given triggering event (e.g., in response to a write erase count reaching a predetermined number of cycles and/or an error level exceeding a threshold error level and/or other factors).

FIG. 8C shows an example of a lookup table for adjustment of Vr1 for read operations directed to NAND strings of first and second regions or groups of regions (e.g., as illustrated in FIGS. 8A-B). The initial read voltage for both region(s) is Vr1 (e.g., 1.0 volts). The read voltage Vr1 may be applied in read operations directed to NAND strings of all regions of the block including the first and second region(s). Subsequently, after a triggering event, read voltage is adjusted differently for each of the first and second region(s). The read voltage is adjusted by a first predetermined amount, $\delta Vr$, for read operations directed to NAND strings of the first region(s) of the block. The read voltage is adjusted by a second predetermined amount, $\delta Vr+\delta Vr'$ for read operations directed to NAND strings of a second region of the block (e.g., as shown in FIG. 8B). For example, $\delta Vr$ may be about 800 millivolts (e.g., between 700 millivolts and 900 millivolts) and $\delta Vr'$ may be about 250 millivolts (e.g., between 200 millivolts and 300 millivolts). The first and second predetermined amounts used for adjustment ($\delta Vr$ and $\delta Vr+\delta Vr'$) may be based on respective locations of the first and second regions in the block. For example, the first predetermined amount, δVr, may be used for one or more regions located at or near an edge of a block (e.g., regions 420 and 460) and the second predetermined amount, δVr+δVr', may be used for one or more regions at interior locations in the block (e.g., regions 430, 440 and 450). Two groups are illustrated in this example. Different groupings may be used in other examples.

FIG. 9 shows an example of a lookup table for an embodiment with three regions or groups of regions with a read voltage adjusted by first, second, and third predetermined amounts for read operations directed to NAND strings of the first, second and third regions of the block. The initial read voltage for all three regions is Vr1 (e.g., 1.0 volts). The read voltage Vr1 may be applied in read operations directed to NAND strings of all regions of the block including the first, second and third regions during an initial period of operation. Subsequently, after a triggering event, read voltage is adjusted differently for each of the first, second and third regions. The read voltage is adjusted by a first predetermined amount, δV, for read operations directed to NAND strings of the first region(s) of the block. The read voltage is adjusted by a second predetermined amount, δV+δV' for read operations directed to NAND strings of a second region of the block. The read voltage is adjusted by a third predetermined amount, δV+δV" for read operations directed to NAND strings of a third region of the block. For example, δV may be about 800 millivolts (e.g., between 700 millivolts and 900 millivolts), δV' may be about 250 millivolts (e.g., between 200 millivolts and 300 millivolts) and δV" may be about 150 millivolts (e.g., between 100 millivolts and 200 millivolts). The first, second and third predetermined amounts used for adjustment (δV, δV+δV' and δV+δV") may be based on respective locations of the first, second and third regions in the block. For example, the first predetermined amount, δV, may be used for one or more regions located at or near an edge of a block (e.g., regions 420 and 460), the second predetermined amount, δV+δV', may be used for one or more regions at interior locations in the block (e.g., region 440) and the third predetermined amount δV+δV" may be used for regions at intermediate locations in the block (e.g., regions 430 and 450). Regions are grouped into three groups in this example, with two or three regions per group (groups of unequal size). In other examples, uniform groups are used. In some examples, no groups are used, and each region is individually adjusted.

Adjustment of read voltage may occur more than once during the lifecycle of a product. Adjustment of read voltage may occur in response to triggering events. An example of a triggering event is a write erase cycle count for a block reaching a predetermined number of cycles. Another example of a triggering event is an amount of elapsed time (e.g., since the last adjustment) or a combination of time and temperature. Another example of a triggering event is an error level (e.g., an FBC or other indicator of error level) reaching a predetermined level. Another example of a triggering event is a command to trigger read voltage adjustment (e.g., from a host). Other examples of triggering events may include other factors. In some cases, triggering events may be based on multiple factors (e.g., a combination of write erase cycle count and FBC). The present technology is not limited to any particular triggering event or any number of such events in a product lifecycle.

FIG. 10 illustrates an example of a lookup table that includes adjustment amounts for adjusting a read voltage, Vr1, for read operations directed to NAND strings of first and second regions of a block multiple times. Three iterations of adjustment are shown corresponding to three triggering events. During an initial period, when a write erase cycle count for the block is between zero and fifty thousand (0-50,000) the initial read voltage, Vr1, is used in the first and second regions. In response to a first triggering event (the write erase cycle count reaching 50,000) a first adjustment of read voltage is performed, which increases read voltage by δV1 for read operations directed to NAND strings of the first region and by δV1+δV1' for read operations directed to NAND strings of the second region. These first adjusted read voltages are used until a second triggering event occurs (the write erase cycle count reaching 75,000), which triggers a second adjustment. The second adjustment increases read voltage by δV2 for read operations directed to NAND strings of the first region and by δV2+δV2' for read operations directed to NAND strings of the second region. The second adjusted read voltages are used until a third triggering event occurs (the write erase cycle count reaching 100,000), which triggers a third adjustment. The third adjustment increases read voltage by δV3 for read operations directed to NAND strings of the first region and by δV3+δV3' for read operations directed to NAND strings of the second region. The third adjusted read voltages are used subsequently in this example.

It can be seen that each region, or group of regions, has a different adjustment scheme in this example. For example, read voltage is increased by δV1, δV2 and δV3 for read operations directed to NAND strings of the first region in a first adjustment scheme while read voltage is additionally increased by δV1', δV2' and δV3' (compared with the first adjustment scheme) for read operations directed to NAND strings of the second region in a second adjustment scheme. The adjustment amounts are different for the first and second in this example (δV1', δV2' and δV3' are non-zero). While this example shows three iterations (three adjustments of read voltage in response to three triggering events), other examples may have fewer than three (e.g., one or two) adjustments, or may have four or more adjustments (e.g., five, six, seven . . . and so on). The present technology is not limited to any number of adjustments.

While the above examples are illustrated with respect to a single read voltage, Vr1 (e.g., a read voltage between threshold voltage distributions of two data states S0 and S1), techniques described herewith may be applied to more than one read voltage that may be used to read memory cells (e.g., in TLC or QLC memory). Where more than two data states are used to store more than one bit per cell, multiple read voltages may be used (e.g., as illustrated in FIG. 6) and any one or more of such read voltages may be adjusted. For example, two, three, four or more of read voltages Vr1, Vr2 . . . Vr7 may be adjusted in response to one or more triggering event. In some examples, all read voltages used to read memory cells may be adjusted (e.g., each of Vr1, Vr2 . . . Vr7).

FIG. 11 shows an example in which seven initial read voltages, Vr1, Vr2 . . . Vr7, are used to read memory cells that have eight threshold voltage distributions corresponding to eight data states to store three bits per cell during a period of operation. The same initial read voltages, Vr1, Vr2 . . . Vr7, are used for first and second regions. Subsequently, after adjustment of the read voltages, each of the read voltages is increased by a predetermined amount, with read voltages Vr1, Vr2 . . . Vr7, increased by first predetermined amounts δV1, δV2 . . . δV7 for read operations directed to NAND strings of the first region(s) and by second predetermined amounts δV1', δV2' . . . δV7' for read operations directed to NAND strings of the first region(s). Thus, each read voltage Vr1, Vr2 . . . Vr7, is adjusted according to a first adjustment scheme for read operations directed to NAND strings of the first region(s) and according to a second adjustment scheme for read operations directed to NAND strings of the first region(s). While seven read voltages are used in this example, the number of read voltages may be less than seven or greater than seven and the present technology is not limited to any number of read voltages. All read voltages may be adjusted in any such scheme or a subset of the read voltages used may be adjusted.

While the above examples show different implementations including more than two regions with different adjustment schemes (FIG. 9), more than one read voltage adjustment during the lifecycle of a product (FIG. 10) and adjustment of more than one read voltage used to read memory cells (FIG. 11), these implementations are not mutually exclusive, and aspects of these different implementations may be combined in various ways.

FIG. 12 shows an example of a lookup table used for blocks that include K regions or groups of regions (represented by K columns in FIG. 12), each having a different adjustment scheme (e.g., different predetermined amounts for adjustment in different regions. K may be any number up to the number of regions in a block, which may be equal to the number of NAND strings in the block that are connected to a given bit line. FIG. 12 shows M+1 different read voltages including initial read voltages, $1^{st}$ adjusted read voltages, $2^{nd}$ adjusted read voltages . . . Mth adjusted read voltages, with each set of adjusted read voltages used during a period of operation (e.g., following adjustment triggered by a triggering event). In each region or group of regions, n read voltages, Vr1, Vr2 . . . Vrn, are adjusted according to a region-specific scheme (or group-specific scheme if regions are grouped). Individual entries are left blank in FIG. 12 for simplicity and may consist of predetermined amounts to adjust a read voltage (e.g., predetermined based on locations of regions). Any of the lookup tables above, including the lookup table of FIG. 12, may be considered as examples of means for storing a first plurality of predetermined amounts for a first plurality of adjustments of the read voltage for read operations directed to NAND strings of a first region of the block in response to a plurality of triggering events and for storing a second plurality of predetermined amounts for a second plurality of adjustments of the read voltage for read operations directed to NAND strings of a second region of the block in response to the plurality of triggering events.

In an embodiment, entries in lookup tables (e.g., lookup tables of any of FIGS. 8C-12) may be generated based on test data obtained from test die (e.g., from one or more lots of test wafers) which may generate values that are sufficiently accurate for all blocks of all dies that are manufactured according to a common design. A lookup table that is generated in a test facility may be stored as or with firmware for a data storage product so that such a lookup table does not have to be individually generated for each die.

Figure 13:
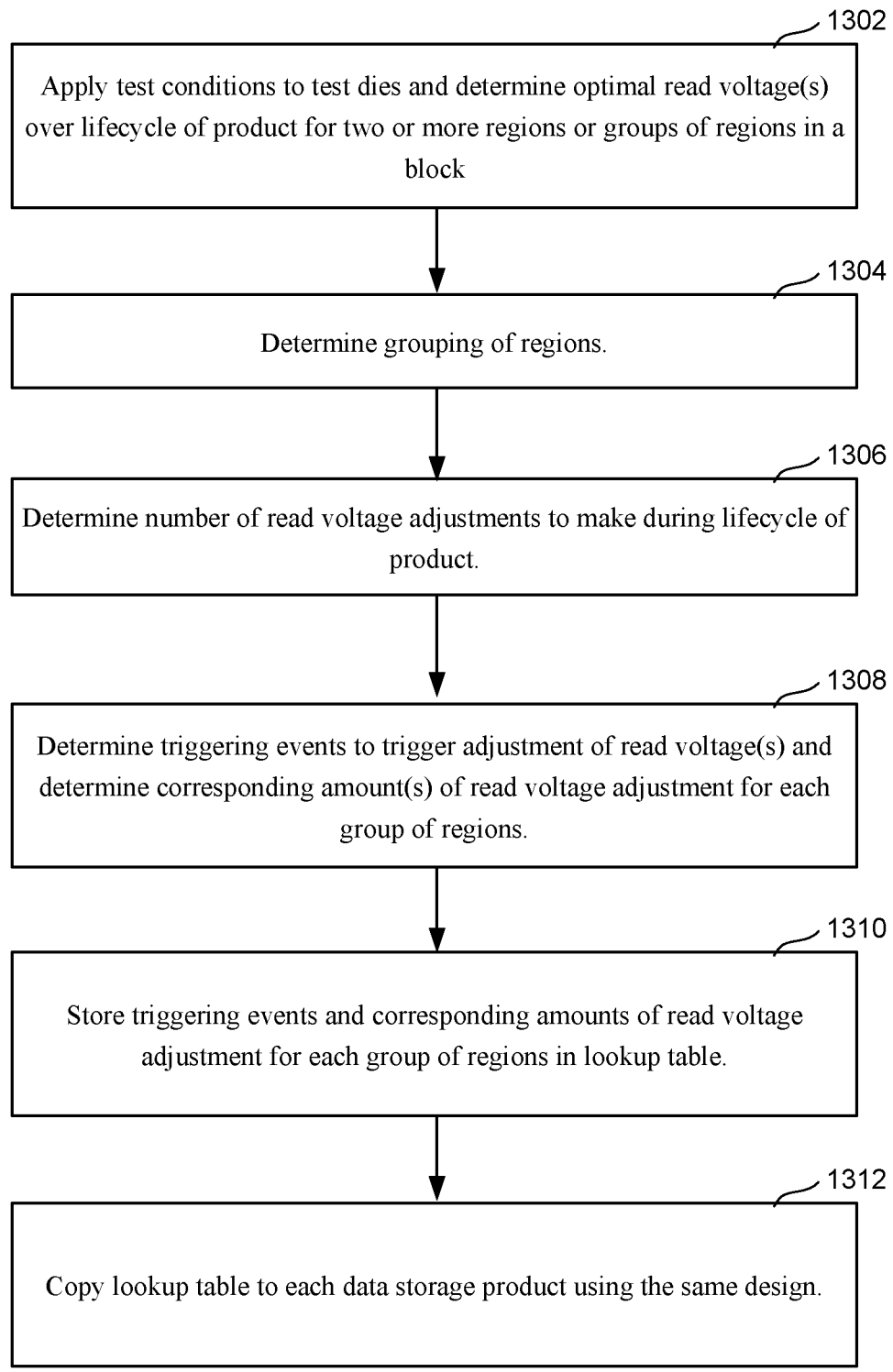
FIG. 13 shows an example of how amounts in a lookup table may be predetermined.

FIG. 13 shows an example of how predetermined adjustment amounts for a lookup table may be generated for use in any of the examples above. The method includes applying test conditions to test dies to determine optimal read voltage (s) over the lifecycle of a product for two or more regions in a block 1302. For example, a sample of test dies may be cycled through a number of write erase cycles from zero to end of life (e.g., 0 to >100,000). High temperature may be applied as part of testing to accelerate age-related defects. Test dies are tested during cycling to determine how threshold voltage distributions and corresponding optimum read voltages change with cycles and/or time over multiple regions (e.g., read voltages to minimize FBC). The method includes determining grouping of regions 1304 and determining the number of read voltage adjustments to make during the lifecycle of the product 1306. Grouping of regions may be made so that regions that change similarly are grouped together (e.g., regions in similar locations may change similarly, with edge regions changing like other edge regions and interior regions changing like other interior regions). In some cases, regions are not grouped and are individually adjusted. The number of read voltage adjustments may be selected to ensure that FBC remains below a maximum (e.g., changed before FBC is large enough to cause significant ECC-related delay or resource consumption). Triggering events to trigger adjustment of read voltage (s) and corresponding amount(s) of read voltage adjustment for each group of regions are determined 1308 (e.g., specific write erase cycle counts and/or error level such as a high FBC with conventional read level scan which cannot be reduced after a certain disturb event and/or amount of cycling to trigger adjustment and corresponding read voltage increases for each region or group of regions). The triggering events and corresponding amounts of read voltage adjustment for each group of regions is stored in a lookup table 1310 and the lookup table is copied to each data storage product using the same design 1312 as the test dies. For example, the lookup table may be part of firmware or accessible by firmware of control circuits used with a given NAND memory structure. The predetermined amounts stored in such a lookup table may then be used by control circuits of a data storage product to adjust read voltages in multiple regions of a block Aspects of the present technology may be implemented using various control circuits to adjust one or more read voltages using different adjustment schemes in different regions of a block. An example of such control circuits may include logic circuits (e.g., control circuit 110 and/or system control logic 360). Such control circuits may be configured (e.g., by dedicated circuits, programmable logic, firmware or a combination) to apply a read voltage in read operations directed to NAND strings of the plurality of regions of the block, subsequently adjust the read voltage by a first predetermined amount for read operations directed to NAND strings of a first region of the block and adjust the read voltage by a second predetermined amount for read operations directed to NAND strings of a second region of the block, the first and second predetermined amounts based on respective locations of the first and second regions in the block. Such control circuits may be considered an example of means for applying a read voltage in read operations directed to NAND strings of the plurality of regions of a block, subsequently adjusting the read voltage by a first predetermined amount for read operations directed to NAND strings of a first region of the block and adjusting the read voltage by a second predetermined amount for read operations directed to NAND strings of a second region of the block, the first and second predetermined amounts based on respective locations of the first and second regions in the block. Such control circuits may include or be connected to a suitable memory that stores one or more lookup table (e.g., as illustrated in any of the examples of FIGS. 8C-12). A lookup table may be stored in memory structure 126 or 326 and/or at another location (e.g., in ROM 122a, ROM 218, storage 366). Any such memory that is used to store a lookup table as described above may be considered an example of means for storing a first plurality of predetermined amounts for a first plurality of adjustments of the read voltage for read operations directed to NAND strings of a first region of the block in response to a plurality of triggering events and for storing a second plurality of predetermined amounts for a second plurality of adjustments of the read voltage for read operations directed to NAND strings of a second region of the block in response to the plurality of triggering events.

While the above examples refer to read voltages used to read data previously stored in memory cells, in some cases one or more verify voltage may be similarly adjusted by different amounts in different regions of a block.

Figure 14:
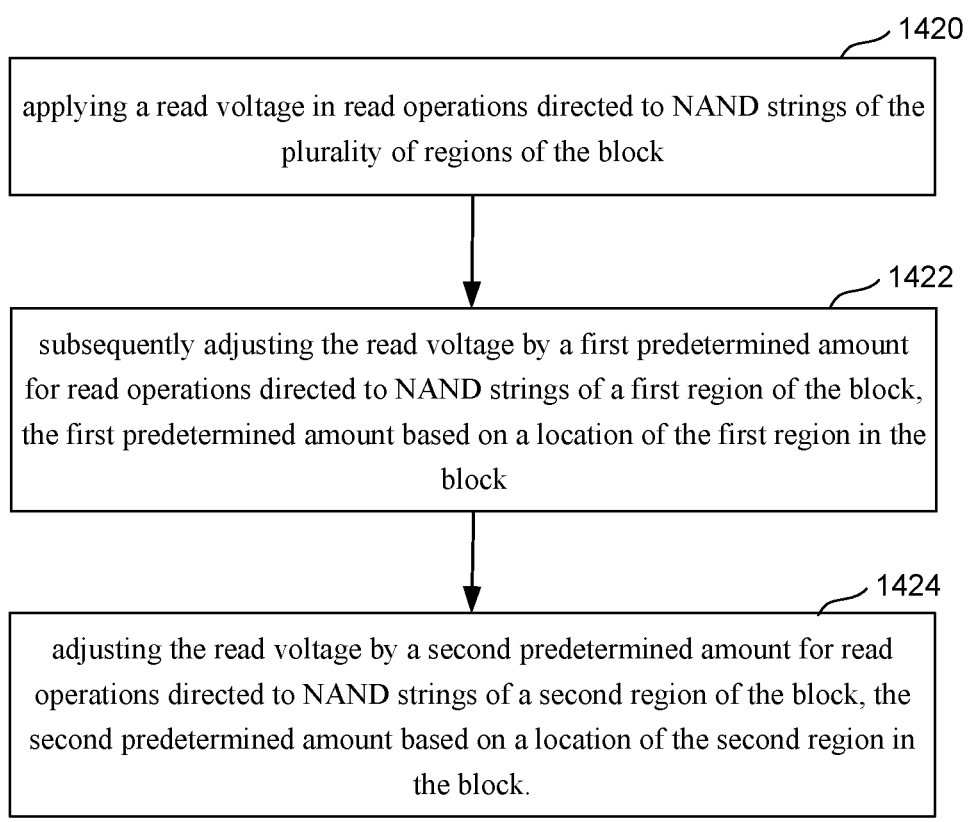
FIG. 14 shows an example of a method of operating a non-volatile memory array.

An example of a method of operating a non-volatile memory array that includes NAND strings of a block connected to bit lines, each bit line connected to a plurality of NAND strings in a corresponding plurality of regions of the block (e.g., as shown in FIG. 4A-C) is illustrated in FIG. 14. The method includes applying a read voltage in read operations directed to NAND strings of the plurality of regions of the block 1420. For example, a single read voltage may be used uniformly across all regions of a block during an initial period of operation (although this is not required, and non-uniform read voltages may be used initially in some cases). The method includes subsequently adjusting the read voltage by a first predetermined amount for read operations directed to NAND strings of a first region of the block, the first predetermined amount based on a location of the first region in the block 1422 (e.g., adjusting a read voltage, Vr1, for a first region by δV based on the first region's edge location at or near an edge of the block) and adjusting the read voltage by a second predetermined amount for read operations directed to NAND strings of a second region of the block, the second predetermined amount based on a location of the second region in the block 1424 (e.g., adjusting the read voltage, Vr1, for a second region by δV+δV' based on the second region's interior location at or near the middle of the block).

In one embodiment an apparatus includes a control circuit configured to connect to NAND strings that are connected to bit lines, each bit line connected to a plurality of NAND strings in a corresponding plurality of regions of a block. The control circuit configured to apply a read voltage in read operations directed to NAND strings of the plurality of regions of the block, subsequently adjust the read voltage by a first predetermined amount for read operations directed to NAND strings of a first region of the block and adjust the read voltage by a second predetermined amount for read operations directed to NAND strings of a second region of the block, the first and second predetermined amounts based on respective locations of the first and second regions in the block.

The control circuit may be further configured to adjust the read voltage for read operations directed to NAND strings of the first and second regions in response to a write erase cycle count of the block reaching a predetermined number of cycles. The control circuit may be further configured to adjust the read voltage for read operations directed to NAND strings of the first and second regions a plurality of times in response to the write erase cycle count of the block reaching a plurality of predetermined numbers of cycles. The control circuit may be further configured to obtain a plurality of predetermined amounts, including the first and second predetermined amounts, the plurality of predetermined amounts corresponding to a plurality of adjustments of the read voltage for read operations directed to NAND strings of the first and second regions in response to the write erase cycle count reaching the plurality of predetermined numbers of cycles, the plurality of predetermined amounts obtained from a lookup table. The block may be configured to store more than one bit per memory cell in more than two data states, the read voltage may be one of a plurality of read voltages used to read a memory cell and the control circuit may be further configured to adjust each of the plurality of read voltages for read operations directed to NAND strings of the first and second regions a plurality of times in response to a write erase cycle count of the block reaching a plurality of predetermined numbers of cycles. The control circuit may be further configured to adjust the plurality of read voltages differently for NAND strings of the first region and NAND strings of the second region. The control circuit may be further configured to obtain first adjustments for the plurality of read voltages for NAND strings of at least the first region and second adjustments for the plurality of read voltages for NAND strings of at least the second region for each of the plurality of predetermined numbers of cycles from a lookup table. The block may consist of five regions separated by local interconnects, the first region may be an edge region of the block, the second region may be an interior region of the block and the second predetermined amount may be greater than the first predetermined amount.

An example method of operating a non-volatile memory array that includes NAND strings of a block connected to bit lines, each bit line connected to a plurality of NAND strings in a corresponding plurality of regions of the block, includes applying a read voltage in read operations directed to NAND strings of the plurality of regions of the block; subsequently adjusting the read voltage by a first predetermined amount for read operations directed to NAND strings of a first region of the block, the first predetermined amount based on a location of the first region in the block; and adjusting the read voltage by a second predetermined amount for read operations directed to NAND strings of a second region of the block, the second predetermined amount based on a location of the second region in the block.

The method may further include maintaining a write erase cycle count for the block and adjusting the read voltage for read operations directed to NAND strings of the first and second regions by the first and second predetermined amounts respectively in response to the write erase cycle count reaching a predetermined number of cycles. The method may further include detecting errors in data read from the block; comparing an error level for the data read from the block with a threshold error level; and triggering adjustment of the read voltage by the first and second predetermined amounts in response to the error level exceeding the threshold error level. The method may further include maintaining a write erase count for the block; in response to the write erase count reaching each predetermined number of cycles of a plurality of predetermined numbers of cycles, obtaining a plurality of predetermined amounts corresponding to the respective predetermined number of cycles from a lookup table; and adjusting the read voltage for read operations directed to NAND strings of the first and second regions according to the plurality of predetermined amounts. The block may be configured to store more than one bit per memory cell in more than two data states, the read voltage may be one of a plurality of read voltages used to read a memory cell, the method may further include: adjusting each of the plurality of read voltages for read operations directed to NAND strings of the first and second regions a plurality of times in response to the write erase cycle count of the block reaching of cycles. The method may further include adjusting the plurality of read voltages for read operations directed to NAND strings of the first region according to a first adjustment scheme; and adjusting the plurality of read voltages for read operations directed to NAND strings of the second region according to a second adjustment scheme. The method may further include maintaining a lookup table that includes entries for the first adjustment scheme including a first plurality of adjustment amounts and entries for the second adjustment scheme including a second plurality of adjustment amounts; maintaining a write erase cycle count for the block; and in each iteration of a plurality of iterations: in response to the write erase cycle count reaching a predetermined number of cycles, obtaining corresponding first and second adjustment amounts from the lookup table; and adjusting read voltage for read operations directed to NAND strings of the first and second regions of the block by the corresponding first and second adjustment amounts obtained from the lookup table. The lookup table may include adjustment amounts for two or more read voltages for reading more than two data states per cell. The method may further include adjusting the read voltage by the first predetermined amount for read operations directed to NAND strings of a third region of the block, the second region located between the first region and the third region.

An example non-volatile storage device includes: an array of non-volatile memory cells that includes a plurality of blocks connected by bit lines, each bit line connected to a plurality of NAND strings in a corresponding plurality of regions of a block; and means for applying a read voltage in read operations directed to NAND strings of the plurality of regions of a block, subsequently adjusting the read voltage by a first predetermined amount for read operations directed to NAND strings of a first region of the block and adjusting the read voltage by a second predetermined amount for read operations directed to NAND strings of a second region of the block, the first and second predetermined amounts based on respective locations of the first and second regions in the block.

The non-volatile storage device may further include means for storing a first plurality of predetermined amounts for a first plurality of adjustments of the read voltage for read operations directed to NAND strings of a first region of the block in response to a plurality of triggering events and for storing a second plurality of predetermined amounts for a second plurality of adjustments of the read voltage for read operations directed to NAND strings of a second region of the block in response to the plurality of triggering events. Each triggering event of the plurality of triggering events may be one of: reaching a predetermined number of write erase cycles for the block, an elapsed period of time or an error level in data from the block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to connect to NAND strings that are connected to bit lines, each bit line connected to a plurality of NAND strings in a corresponding plurality of regions of a block, the control circuit configured to:
apply a read voltage in read operations directed to NAND strings of the plurality of regions of the block, subsequently, in response to a write erase cycle count of the block reaching a predetermined number of cycles, adjust the read voltage by a first predetermined amount for read operations directed to NAND strings of a first region of the block and adjust the read voltage by a second predetermined amount for read operations directed to NAND strings of a second region of the block, the first and second predetermined amounts based on respective locations of the first and second regions in the block.

2. The apparatus of claim 1, wherein the control circuit is further configured to adjust the read voltage by the first predetermined amount for read operations directed to NAND strings of a third region of the block, the second region located between the first region and the third region.

3. The apparatus of claim 1, wherein the control circuit is further configured to adjust the read voltage for read operations directed to NAND strings of the first and second regions a plurality of times in response to the write erase cycle count of the block reaching a plurality of predetermined numbers of cycles.

4. The apparatus of claim 3, wherein the control circuit is further configured to obtain a plurality of predetermined amounts, including the first and second predetermined amounts, the plurality of predetermined amounts corresponding to a plurality of adjustments of the read voltage for read operations directed to NAND strings of the first and second regions in response to the write erase cycle count reaching the plurality of predetermined numbers of cycles, the plurality of predetermined amounts obtained from a lookup table.

5. The apparatus of claim 1, wherein the block is configured to store more than one bit per memory cell in more than two data states, the read voltage is one of a plurality of read voltages used to read a memory cell and the control circuit is further configured to adjust each of the plurality of read voltages for read operations directed to NAND strings of the first and second regions a plurality of times in response to a write erase cycle count of the block reaching a plurality of predetermined numbers of cycles.

6. The apparatus of claim 5, wherein the control circuit is further configured to adjust the plurality of read voltages differently for NAND strings of the first region and NAND strings of the second region.

7. The apparatus of claim 6, wherein the control circuit is further configured to obtain first adjustments for the plurality of read voltages for NAND strings of at least the first region and second adjustments for the plurality of read voltages for NAND strings of at least the second region for each of the plurality of predetermined numbers of cycles from a lookup table.

8. The apparatus of claim 1, wherein the block consists of five regions separated by local interconnects, the first region is an edge region of the block, the second region is an interior region of the block and the second predetermined amount is greater than the first predetermined amount.

9. A method of operating a non-volatile memory array that includes NAND strings of a block connected to bit lines, each bit line connected to a plurality of NAND strings in a corresponding plurality of regions of the block, the method comprising:
applying a read voltage in read operations directed to NAND strings of the plurality of regions of the block;
subsequently adjusting the read voltage by a first predetermined amount for read operations directed to NAND strings of a first region of the block, the first predetermined amount based on a location of the first region in the block;
adjusting the read voltage by a second predetermined amount for read operations directed to NAND strings of a second region of the block, the second predetermined amount based on a location of the second region in the block; and
adjusting the read voltage by the first predetermined amount for read operations directed to NAND strings of a third region of the block, the second region located between the first region and the third region.

10. The method of claim 9, further comprising:
maintaining a write erase cycle count for the block and adjusting the read voltage for read operations directed to NAND strings of the first and second regions by the first and second predetermined amounts respectively in response to the write erase cycle count reaching a predetermined number of cycles.

11. The method of claim 9, further comprising:
detecting errors in data read from the block;
comparing an error level for the data read from the block with a threshold error level; and
triggering adjustment of the read voltage by the first and second predetermined amounts in response to the error level exceeding the threshold error level.

12. The method of claim 9, further comprising:
maintaining a write erase count for the block;
in response to the write erase count reaching each predetermined number of cycles of a plurality of predetermined numbers of cycles, obtaining a plurality of predetermined amounts corresponding to the respective predetermined number of cycles from a lookup table; and
adjusting the read voltage for read operations directed to NAND strings of the first and second regions according to the plurality of predetermined amounts.

13. The method of claim 12, wherein the block is configured to store more than one bit per memory cell in more than two data states, the read voltage is one of a plurality of read voltages used to read a memory cell, the method further comprising:
adjusting each of the plurality of read voltages for read operations directed to NAND strings of the first and second regions a plurality of times in response to the write erase cycle count of the block reaching of cycles.

14. The method of claim 13, further comprising:
adjusting the plurality of read voltages for read operations directed to NAND strings of the first region according to a first adjustment scheme; and
adjusting the plurality of read voltages for read operations directed to NAND strings of the second region according to a second adjustment scheme.

15. The method of claim 14, further comprising:
maintaining a lookup table that includes entries for the first adjustment scheme including a first plurality of adjustment amounts and entries for the second adjustment scheme including a second plurality of adjustment amounts;
maintaining a write erase cycle count for the block; and
in each iteration of a plurality of iterations:
in response to the write erase cycle count reaching a predetermined number of cycles, obtaining corresponding first and second adjustment amounts from the lookup table; and
adjusting read voltage for read operations directed to NAND strings of the first and second regions of the block by the corresponding first and second adjustment amounts obtained from the lookup table.

16. The method of claim 15, wherein the lookup table includes adjustment amounts for two or more read voltages for reading more than two data states per cell.

17. The method of claim 9, further comprising:
adjusting the read voltage for read operations directed to NAND strings of the first, second and third regions a plurality of times in response to a write erase cycle count of the block reaching a plurality of predetermined numbers of cycles.

18. A non-volatile storage device comprising:
an array of non-volatile memory cells that includes a plurality of blocks connected by bit lines, each bit line connected to a plurality of NAND strings in a corresponding plurality of regions of a block;
means for applying a read voltage in read operations directed to NAND strings of the plurality of regions of a block, subsequently adjusting the read voltage by a first predetermined amount for read operations directed to NAND strings of a first region of the block and adjusting the read voltage by a second predetermined amount for read operations directed to NAND strings of a second region of the block, the first and second predetermined amounts based on respective locations of the first and second regions in the block; and
means for storing a first plurality of predetermined amounts for a first plurality of adjustments of the read voltage for read operations directed to NAND strings of a first region of the block in response to a plurality of triggering events and for storing a second plurality of predetermined amounts for a second plurality of adjustments of the read voltage for read operations directed to NAND strings of a second region of the block in response to the plurality of triggering events.

19. The non-volatile storage device of claim 18, wherein the array of non-volatile memory cells is formed on a first die, the means for applying a read voltage and the means for storing are located on a second die, the first die and the second die are coupled to form an integrated memory assembly.

20. The non-volatile storage device of claim 18, wherein each triggering event of the plurality of triggering events is based on one or more of: reaching a predetermined number of write erase cycles for the block and an error level in data from the block exceeding a threshold level.

* * * * *